United States Patent [19]

Bauer

[11] Patent Number: 4,967,244
[45] Date of Patent: Oct. 30, 1990

[54] POWER SEMICONDUCTOR COMPONENT WITH SWITCH-OFF FACILITY

[75] Inventor: Friedheim Bauer, Würenlingen, Switzerland

[73] Assignee: Asea Brown Boveri Ltd, Baden, Switzerland

[21] Appl. No.: 334,567

[22] Filed: Apr. 7, 1989

[30] Foreign Application Priority Data

Apr. 22, 1988 [CH] Switzerland .................. 1520/88

[51] Int. Cl.⁵ .................. H01L 29/10; H01L 29/78; H01L 29/74; H01L 27/02
[52] U.S. Cl. .................. 357/23.4; 357/38; 357/43
[58] Field of Search .................. 357/23.4, 38, 43

[56] References Cited

U.S. PATENT DOCUMENTS

| | | | |
|---|---|---|---|
| 4,402,003 | 8/1983 | Blanchard | 357/43 |
| 4,443,931 | 4/1984 | Baliga et al. | 29/571 |
| 4,466,176 | 8/1984 | Temple | 29/571 |
| 4,618,872 | 10/1986 | Baliga | 357/23.4 |
| 4,642,666 | 2/1987 | Lidow et al. | 357/23.4 |
| 4,799,095 | 1/1989 | Baliga | 357/38 |
| 4,857,983 | 8/1989 | Baliga et al. | 357/38 |

FOREIGN PATENT DOCUMENTS 0118007 9/1984 European Pat. Off. .
0219995 4/1987 European Pat. Off. .

OTHER PUBLICATIONS

Transactions on Electron Devices, vol. ED-33, No. 10, Oct. 1986, V. A. K. Temple: "MOS-Controlled Thyristors-A New Class of Power Devices", pp. 1609-1618.
Transactions on Electron Devices, vol. ED-31, No. 6, Jun. 1984, B. Jayant Baliga, et al.: "The Insulated Gate Transistor: A New Three-Terminal MOS-Controlled Bipolar Power Device", pp. 821-828.

*Primary Examiner*—Rolf Hille
*Assistant Examiner*—David M. Ostrowski
*Attorney, Agent, or Firm*—Oblon, Spivak, McClelland, Maier & Neustadt

[57] ABSTRACT

In a power semiconductor component with switch-off facility in which the switch-off capability is achieved by MCT unit cells, IGBT unit cells which are connected in parallel with the MCT unit cells are provided for switching on.

This structure ensures an improved switch-on capability and an increased flexibility in designing the component.

7 Claims, 1 Drawing Sheet

POWER SEMICONDUCTOR COMPONENT WITH SWITCH-OFF FACILITY

BACKGROUND OF THE INVENTION

1. Field of the Invention

The present invention relates to the field of power electronics. It relates in particular to a power semiconductor component with switch-off facility in which a plurality of unit cells are arranged next to each other and connected in parallel in a semiconductor substrate between an anode and a cathode;

each of said unit cells is constructed as a MOS-controlled thyristor (MCT=MOS Controlled Thyristor) which can be switched off by means of a field-effect-controlled short circuit; and means are additionally provided which ensure the field-effect-controlled switching-on of the component.

Such a component is known, for example, from the paper by V. A. K. Temple, IEEE Trans. Electron Devices, ED-33, pages 1609–1618 (1986).

2. Discussion of Background

For some years, the development of MOS-controlled components has been increasingly accelerate in power electronics. This trend was initiated by the unipolar power MOSFETs having DMOS structure.

The advantage of these MOS-controlled components is based mainly on the high input impedance of the gate electrode. This makes it possible to trigger the component with a comparatively low expenditure of power.

The DMOSFETs have, however, a serious disadvantage: because of the unipolar nature of conduction, high breakdown voltages have to be paid for in these components with high on-state resistances which limit the maximum current level.

A solution has recently been provided for this problem by the IGBT (Insulated Gate Bipolar Transistor) (on this point see B. J. Baliga et al., IEEE Trans. Electron Devices, ED-31, pages 821–828 (1984)).

The IGBT has a cathode structure which is largely similar to that of the DMOSFET. In a simplified manner, it can be thought of as a cascade circuit comprising a DMOSFET and a bipolar transistor. As a consequence of the bipolar current transfer in the high-resistance n-type base layer, this region is conductivity-modulated; consequently, a low value can be achieved for the onstate resistance even in the case of components with high reverse voltage.

It has now furthermore been proposed to achieve the concept described of controlling the power semiconductor components by means of MOS gates even in the case of components of the highest power class, namely in the case of thyristors (on this point see the paper mentioned in the introduction by V. A. K. Temple).

In such a MOS controlled thyristor or MCT (MOS Controlled Thyristor), which comprises a plurality of parallel-connected unit cells situated next to each other, switching-off is achieved by means of short-circuiting the emitter to the p-type base by means of switchable emitter shorts. For this purpose, MOSFETs which are integrated with the emitter and which can naturally be constructed optionally as n- or p-channel MOSFETs are used as switches.

With a view to simple circuit engineering, it is naturally desirable to use the MOS gates not only to switch the thyristor off but also to switch it on. This should be attainable, if possible, with a single gate electrode.

A structure which fulfills these requirements has already been proposed in the paper by V. A. K. Temple (FIG. 5 therein). This is a combined switch-on and switch-off cell in which a further DMOS structure is used inside the original MCT unit cell in order to inject electrons into the n-type base layer via a channel in the p-type base layer pulled up to the substrate surface.

These known combined switch-on and switch-off cells, however, raise two problems;

The channel of the DMOSFET used to switch on, is formed by the p-type base layer which is pulled to the surface. For typical thyristors, the depth of the p-type base layer varies in the range of at least 20 micrometres. This dimension therefore corresponds approximately to the channel length of the DMOSFET. It is consequently considerably larger than the typical channel lengths of IGBTs, which are approximately 1 micrometre. Owing to the large channel length, fewer electrons are injected into the n-type base layer, which impedes the efficient build-up of a plasma during switch-on and prolongs the switch-on time.

On the other hand, the use of combined switch-on and switch-off cells has the consequence that at most just as many switch-on elements as switch-off elements are present in the component. There is therefore no possibility of optimizing the number and distribution of these elements independently of each other in relation to the requirements imposed on the component.

SUMMARY OF THE INVENTION

Accordingly one object of this invention is to provide a novel power semiconductor component with switch-off facility which is outstanding for improved switching characteristics and at the same time can be more simply optimized.

This object is achieved in a component of the type mentioned in the introduction, wherein the additional means comprise further unit cells which are arranged between the MCT unit cells and are connected in parallel with the latter; and each of the further unit cells has the structure of a bipolar transistor with insulated gate (IGBT).

The essence of the invention is therefore to replace the previous combined switch-on and switch-off cells by two separate MCT and IGBT unit cells connected in parallel.

In this manner, the IGBT unit cell responsible for switching on can be optimally designed in relation to its channel length. In addition, the IGBT unit cells are able to take over some of the on-state current in the switched-on state and support the switch-off function of the MCT unit cells. Finally, more IGBT units can be provided than MCT units in order to prevent any formation of current filaments in the component.

A preferred exemplary embodiment of the invention is therefore one wherein each MCT unit cell comprises, between the anode and the cathode, a layer sequence composed of a $p^+$-doped p-type emitter layer, an n-doped n-type base layer, a p-doped p-type base layer and an $n^+$-doped n-type emitter region with laterally adjacent n-doped channel regions and embedded $p^+$-doped source regions;

in the MCT unit cell, the source regions, the channel regions and the p-type base layer emerge next to each other at the cathode-side surface of the semiconductor substrate and in each case form a p-channel MOSFET with an insulated gate electrode situated above it;

each IGBT unit cell comprises, between the anode and the cathode, a layer sequence composed of p+-doped p-type emitter layer, an n-doped n-type base layer and a p+-doped p+-type region with laterally adjacent p-doped channel regions and embedded in n+-doped source regions;

in the IGBT unit cells, the source regions, the channel regions and the n-type base layer emerge next to each other at the cathode-side surface of the semiconductor substrate and in each case form an n-channel MOSFET with an insulated gate electrode situated above it; and the p-type emitter layers and the n-type base layers of both elementary cells are in each case part of a common p-type emitter layer or n-type base layer respectively extending laterally over the semiconductor substrate.

In the same way, however, a complementary component can also be realized in which n-channel MOSFETs are used in the MCT unit cell and p-channel MOSFETs are used in the IGBT unit cell.

Further exemplary embodiments emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
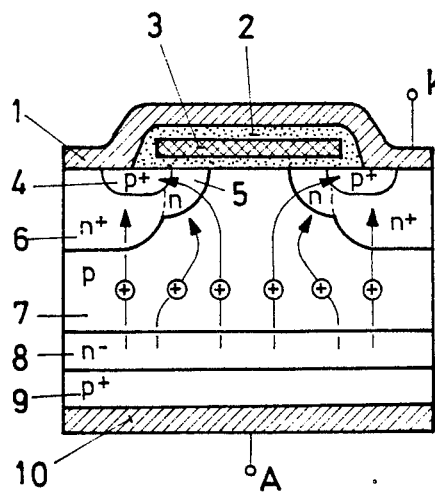
FIG. 1 shows an MCT unit cell of an MOS-controlled thyristor according to the prior art.

Referring now to the drawings, wherein like reference numerals designate identical or corresponding parts throughout the several views, FIG. 1 shows in cross-section, the MCT unit cell of an MOS-controlled thyristor as it is known from FIG. 3b of the publication mentioned in the introduction.

In this unit cell, a plurality of variously doped layers are arranged in a layer sequence between an anode A and a cathode K in a semiconductor substrate 14. The layer sequence comprises a p+-doped p-type emitter layer 9, a n-doped n-type base layer 8, a p-doped p-type base layer 7 and a n+-doped n-type emitter region 6 with laterally adjacent n-doped channel regions 5 and embedded p+-doped source regions 4.

The n-type emitter region 6 emerges between the embedded source regions 4 at the cathode-side surface of the semiconductor substrate 14 and contact is made to it at that point by a cathode contact 1 in the form of a metallization. P-type emitter layer 9, n-type base layer 8, p-type base layer 7 and n-type emitter region 6 form a conventional pnpn thyristor structure in this region. The switching-off of the thyristor is achieved by switching on MOS-controlled short circuits on the cathode side which short-circuit the p-type base layer 7 to the cathode contact 1.

For this purpose, the source regions 4, the channel regions 5 and the p-type base layer 7 emerge next to each other at the cathode-side substrate surface and in each case form at that point a p-channel MOSFET which is controlled by an insulated gate electrode 3 situated above it which is insulated by a gate insulation 2.

If the thyristor is switched on, the holes (shown as circles in FIG. 1) which are injected from the p-type emitter layer 9 into the p-type base layer are drained via the n-type emitter region 6 to the cathode K.

As soon as the gate electrode 3 becomes sufficiently negatively biased, there are formed in the channel regions 5 below the substrate surface p-type conducting inversion channels which, owing to the higher conductivity take over the major portion of the hole current and, consequently, lower the current in the thyristor region below the level of the holding current: the thyristor switches off.

The structure shown in FIG. 1 relates only to the switch-off mechanism of the thyristor. To switch on, additional measures therefore have to be provided. One measure, which is also known from the said paper by V. A. K. Temple, will be explained with reference to FIG. 2.

In this figure, the unit cell according to FIG. 1 is extended so that it takes over the switch-on function in addition to the switch-off function, i.e. it represents a combined switch-on and switch-off cell.

The additional function of switching on is realized in that the p-type base layer 7 and the n-type base layer 8 below the gate electrode 3 are pulled up to the cathode-side substrate surface. The surface-adjacent regions of the p-type base layer 7 then also form a channel region and in each case form an n-channel MOSFET together with the adjacent channel region 5 and the n-type base layer 8.

As soon as the gate electrodes become sufficiently positively biased, the n-channels of these second MOSFETs become conducting. Consequently, electrons enter the n-type base layer 8 and in turn bring about injection of holes from the p-type emitter layer 9. The p-channels of the first MOSFETs in the channel regions 5 are non-conducting at this gate bias. The short circuits are therefore switched off and the thyristor is therefore in a state of maximum standby for triggering, with the result that the initiated plasma can spread out unimpeded and set the thyristor to the on state.

As can be gathered from this description, the triggering process is critically dependent on the characteristics of the n-channels via which electrons enter the n-type base layer 8. In order to achieve a good triggering, the n-channels should therefore have as low a resistance as possible, i.e. as short a length as possible for a given conductivity. This condition, however, can be fulfilled only incompletely with the structure shown in FIG. 2 because the length of the n-channels therein cannot be optimized independently but are also critically determined by the relatively large depth of the p-type base layer 8.

According to the invention, a completely different path is therefore pursued: the switch-on and switch-off function is no longer performed by a combined unit cell but another unit cell which has the IGBT structure as it is known from the paper by B. J. Baliga et al. is connected in parallel with the MCT unit cell in FIG. 1.

Figure 3:
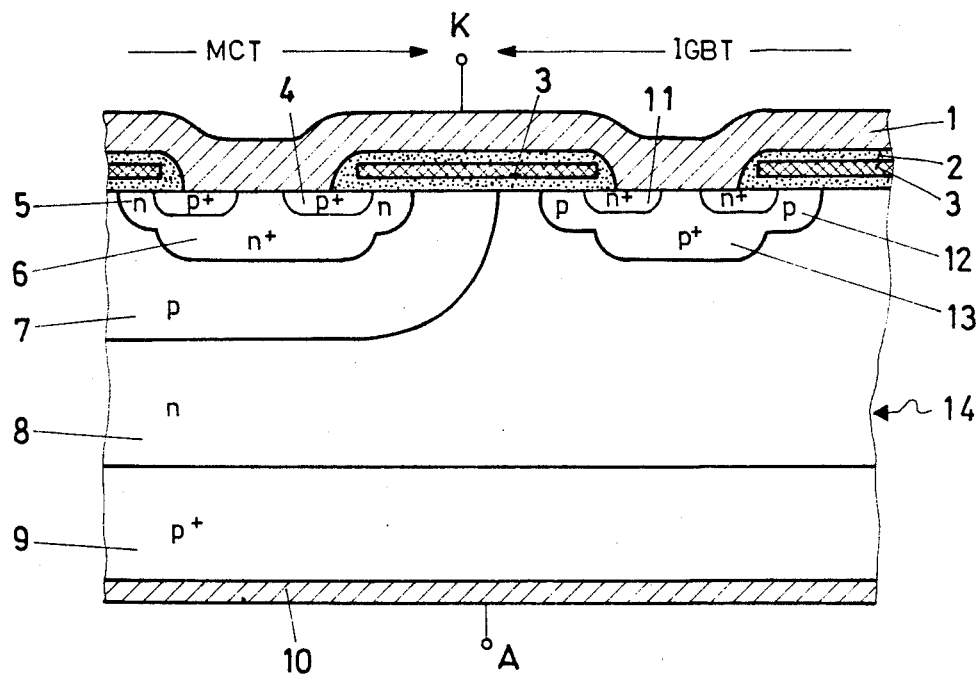
FIG. 3 shows an exemplary embodiment for an adjacently situated MCT and IGBT unit cell according to the invention.

A preferred embodiment of such a component with two different unit cells is shown in FIG. 3.

The left-hand part of the structure shown in FIG. 3 forms the MCT unit cell known from FIG. 1 having the MOS-controlled short circuit. This MCT unit cell is essentially responsible for the switch-off process.

The right-hand part of the structure forms an IGBT unit cell known per se. The p-type emitter layer 9 and the n-type base layer 8 are at the same time constructed as continuous layers. The p-type base layer 7 is pulled to the surface outside the MCT unit cell, which can be achieved simply by a masked implantation and a subsequent diffusion.

In addition to the p-type emitter layer 9 and the n-type base layer 8, the IGBT unit cell also contains a $p^+$-type region 13 with laterally adjacent p-doped channel regions 12 and embedded $n^+$-doped source regions 11 which, together with the channel regions 12 and the n-type base layer 8 form in each case n-channel MOSFETs.

The switching on of the thyristor is ensured by the IGBT unit cell. In this case, the gate electrodes 3 are preferably all at the same potential, with the result that adjacent MCT and IGBT unit cells can even be triggered with the same gate electrode (as shown in FIG. 3).

The function of the IGBT unit cell is as follows: the IGBT structure is a component of the n-channel type. If, therefore, the associated gate electrode 3 is biased sufficiently positively, the n-channel becomes conducting and in principle the same mechanism occurs as has been described for the triggering process of the structure in FIG. 2.

In the case of switching off with negative gate bias, the short circuits in the MCT unit cell are switched on in a known manner and the n-channels in the IGBT unit cell are blocked, with the result that the current is reliably below the holding current.

Figure 2:
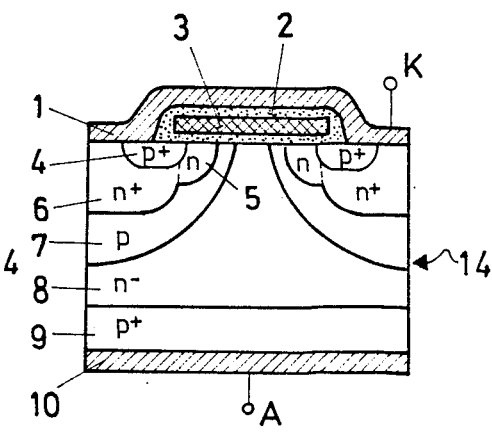
FIG. 2 shows a combined switch-on and switch-off cell of a MOS-controlled thyristor according to the prior art.

The advantages of the arrangement in FIG. 3 over those of that in FIG. 2 emerge from the following consideration: the basic structure in FIG. 2 comprises the n-type emitter region 6 which is locally embedded in the p-type base layer 7. The n-type emitter region 6 furthermore contains the source regions 4 and also the channel regions 5 which represent the channel of the p-channel MOSFETs for switching the short circuits.

In their turn, the channel regions 5 are the source regions for the n-channel MOSFETs for triggering the thyristor. The channel is in this case formed by the p-type base layer 7 pulled to the surface. As already noted, this structure functions in the same manner as the combination of MCT unit cell and IGBT unit cell according to FIG. 3.

For typical thyristors, the depth of the p-type base layer 7 should be in the region of at least 20 micrometres. It is clear that this dimension then also corresponds approximately to the channel length of the n-channel MOSFETs.

The channel length is therefore substantially larger than the typical channel length of IGBTs which are about 1 micrometer. In this connection it is important to realize that, as a result of this circumstance, the IGBT injects more electrons into the base than the structure according to FIG. 2. The important consequence of this is a substantially more efficient build-up of the plasma. Owing to the switch-on time of the IGBT, which is known to be short, sufficient plasma is available even after a short time to trigger the entire component reliably.

The proposed MCT-IGBT combination is a parallel connection of the two components. The IGBT unit cell can accordingly take over a part of the on-state current.

More important still is the fact that the IGBT is able to play a substantial and active role during switch-off. This is to drain holes out of the n-type base layer 8 and thus support the switch-off process of the MCT.

This circumstance can also be made use of to solve a problem which occurs in the MCT, namely, that of the formation of current filaments during switch-off. Since, in the component according to the invention, MCT and IGBT unit cells can be provided in an unequal number and distribution independently of each other, it is possible and advantageous to incorporate IGBT and MCT unit cells in a numerical ratio of greater than 2:1, preferably of about 3:1.

Owing to the large number of IGBT unit cells, such mixed components are free of filament formation (which does not occur in the IGBT), but have, on the other hand, a substantially lower on-state resistance than a pure IGBT owing to the MCT unit cells.

Finally it should also be pointed out that such a component can also be constructed in a structure complementary to FIG. 3 as a combination of an n-channel MCT and a p-channel IGBT.

Obviously, numerous modifications and variations of the present invention are possible in the light of the above teachings. It is therefore to be understood that within the scope of the appended claims, the invention may be practised otherwise than as specifically described herein.

What is claimed as new and is desired to be secured by letters patent of the United States is:

1. A power semiconductor component with switch-off facility, comprising:
   a plurality of unit cells arranged next to each other and connected in parallel in a semiconductor substrate between an anode and a cathode;
   each of said unit cells constructed as an MOS-controlled thyristor (MCT=MOS Controlled Thyristor) which can be switched off by means of a field-effect-controlled short circuit; and
   means for ensuring the field-effect-controlled switching-on of the component;
wherein:
   said means for ensuring means comprise further unit cells which are arranged between the MCT unit cells and are connected in parallel with the latter;
   each of the further unit cells has the structure of a bipolar transistor with insulated gate (IGBT=Insulated Gate Bipolar Transistor);
   each MCT unit cell comprises, between the anode (A) and the cathode (K), a layer sequence composed of a heavily-doped emitter layer of a first conductivity-type, a medium-doped base layer of a second conductivity-type, a medium-doped base layer of the first conductivity-type, and a heavily-doped emitter region of the second conductivity-type with laterally adjacent medium-doped channel regions of the second conductivity-type and embedded heavily-doped source regions of the first conductivity-type;
   in the MCT unit cells, the source regions, the channel regions and the base layer of the first conductivity-type emerge next to each other at the cathode-side surface of the semiconductor substrate and in each case form a first conductivity-type-channel MOSFET with an insulated gate electrode situated above it;

each IGBT unit cell comprises, between the anode and the cathode a layer sequence composed of a heavily-doped emitter layer of the first conductivity-type, a medium-doped base layer of the second conductivity-type and a heavily-doped region of the first conductivity-type with laterally adjacent medium-doped channel regions of the first conductivity-type and embedded heavily-doped source regions of the second conductivity-type;

in the IGBT unit cells, the source regions, the channel regions and the second conductivity-type base layer emerge next to each other at the cathode-side surface of the semiconductor substrate and in each case form a second conductivity-type-channel MOSFET with an insulated gate electrode situated above it; and the first conductivity-type emitter layers and the second conductivity-type base layers of both elementary cells are in each case part of a common first conductivity-type emitter layer or second conductivity-type base layer respectively extending laterally over the semiconductor substrate.

2. The component as claimed in claim 1, wherein said first conductivity-type is p-type and said second conductivity-type is n-type.

3. The component as claimed in claim 1, wherein said first conductivity-type is n-type and said second conductivity-type is p-type.

4. The component as claimed in one of the claims 2 or 3, wherein the gate electrodes of all the unit cells are at the same potential.

5. The component as claimed in claim 1, wherein the numbers of the MCT unit cells and of the IGBT unit cells per component are unequal.

6. The component as claimed in claim 5, wherein the ratio of the number of IGBT unit cells to the number of MCT unit cells is greater than 2:1.

7. The component as claimed in claim 6, wherein this ratio is about 3:1.

* * * * *